United States Patent
Myland

(12) 
(10) Patent No.: US 6,722,056 B2
(45) Date of Patent: Apr. 20, 2004

(54) DRYING VAPOR GENERATION

(75) Inventor: Lawrence J. Myland, West Chester, PA (US)

(73) Assignee: Akrion, LLC, Allentown, PA (US)

(*) Notice: Subject to any disclaimer, the term of this patent is extended or adjusted under 35 U.S.C. 154(b) by 0 days.

(21) Appl. No.: 10/098,847

(22) Filed: Mar. 15, 2002

(65) Prior Publication Data

US 2002/0129513 A1 Sep. 19, 2002

Related U.S. Application Data

(60) Provisional application No. 60/275,934, filed on Mar. 15, 2001.

(51) Int. Cl.[7] .............................................. F26B 21/00
(52) U.S. Cl. ............................. 34/381; 34/467; 34/444; 34/480; 34/524; 34/179; 34/181
(58) Field of Search ......................... 34/444, 381, 467, 34/480, 524, 179, 181

(56) References Cited

U.S. PATENT DOCUMENTS

| | | | | |
|---|---|---|---|---|
| 4,984,597 A | * | 1/1991 | McConnell et al. | 134/95 |
| 5,571,337 A | * | 11/1996 | Mohindra et al. | 134/25.4 |
| 5,685,086 A | * | 11/1997 | Ferrell | 34/61 |
| 5,749,159 A | * | 5/1998 | Schenkler et al. | 34/426 |
| 6,165,277 A | * | 12/2000 | Florez | 134/2 |
| 6,219,936 B1 | | 4/2001 | Kedo et al. | |
| 6,430,840 B1 | * | 8/2002 | Jung | 34/468 |

* cited by examiner

Primary Examiner—Kenneth B Rinehart
(74) Attorney, Agent, or Firm—Michael B. Fein; Brian L. Belles; Cozen O'Connor P.C.

(57) ABSTRACT

Drying semiconductor wafers or substrates by introducing an polar organic compound in liquid form into or onto means for enhancing evaporation within a process chamber and allowing the liquid to evaporate and form a drying vapor within the process chamber.

28 Claims, 5 Drawing Sheets

DRYING VAPOR GENERATION

CROSS-REFERENCE TO RELATED APPLICATIONS

Benefit of Provisional Application 60/275,934, filed Mar. 15, 2001, is claimed.

BACKGROUND OF THE INVENTION

This invention relates to the field of manufacture of semiconductors and other electronic devices wherein a substrate or wafer must be dried.

Prior methods and apparatus for drying semiconductor substrates or wafers involved introducing a drying alcohol such as isopropyl alcohol (IPA) into a process chamber in vapor form. For example, Kedo, et al, U.S. Pat. No. 6,219,936 discloses jetting liquid phase IPA at a temperature higher than that of the wafers in the vicinity of jetting openings where nitrogen gas is simultaneously introduced. The pure water held on the surfaces of the wafers is replaced in Kedo's system by IPA in mist form, and then evaporated from the surface of the wafers to cause drying.

Mohindra, et al., U.S. Pat. No. 5,571,337, discloses bubbling nitrogen gas through IPA in a vessel, and then introducing the resultant gas containing a trace amount of IPA vapor into the process chamber.

McConnell, et al., U.S. Pat. No. 4,984,597, discloses a vaporizer with automatic refill mechanism to produce saturated drying vapor outside the chamber, which is then introduced into the process vessel and flashed to a superheated vapor.

Ferrell U.S. Pat. No. 5,685,086, discloses use of nozzles within the process vessel to generate aerosols.

There are several disadvantages to the prior art systems and methods wherein IPA vapor must be generated outside the process vessel or aerosols generated with nozzles within the process vessel.

It is an object of the present invention to provide a more efficient method and apparatus for generating drying alcohol vapor in connection with drying semiconductor wafers or substrates.

It is another object of the invention to avoid the separate components and process steps involved in generation of drying alcohol vapor required by the prior art systems.

Another object of the present invention is to provide a process and apparatus for a more through drying of, superior particle performance on, and increased throughput in, the processing of substrates which includes a Marangoni effect drying step.

SUMMARY OF THE INVENTION

These objects, and others which will become apparent from the following disclosure and drawings, are achieved by the present invention which comprises in one aspect a method of drying semiconductor wafers or substrates comprising introducing an polar organic compound in liquid form onto or into means for enhancing evaporation within a process chamber, causing the liquid to evaporate and form a drying vapor within the process chamber.

In another aspect, the invention comprises apparatus for drying semiconductor wafers or substrates comprising a process chamber, an evaporation enhancing material or device within the chamber, and a system to introduce polar organic compound in liquid form into or onto the evaporation enhancing material or device, whereby the polar organic compound is converted from liquid form to vapor form within the chamber.

Preferred polar organic compounds are the ones which are conventionally used in Marangoni effect drying of semiconductor wafers or substrates, for example alcohols such as isopropyl alcohol (IPA), 1-methoxy-2-propanol, and di-acetone alcohol. IPA is most preferred.

Suitable evaporation enhancing materials or devices for use within the process chamber include a porous tube, a filter element, or an open trough. Other materials or devices can also be used if they efficiently enhance evaporation and do not introduce any particles.

In the case of the porous tube, it is preferable to use a tube having micropores of about 20 to 50 microns in diameter. In the case of a trough, a suitable one is an open, flat bottomed trough made of a fluoropolymer such as polyvinylidene fluoride (PVDF).

Other suitable porous materials are those used in conventional filter elements, as long as they do not generate particles. In the case of the trough, a tube can be used for introducing the liquid polar organic compound into the trough, and a processor-controlled valve or series of valves can be used for controlling the rate of flow of polar organic compound into the trough.

In the case of a filter element or the porous tube, evaporation rate of the polar organic compound is increased by at least an order of magnitude by a wicking action by capillary effect that increases the surface area of the polar organic compound.

The filter element is preferably a fluoropolymer in a filter assembly positioned in an upper area of the process chamber, the element having a surface area of about 100 to 800 $cm^2$ and being capable of being wetted with the polar organic compound. A preferred fluoropolymer for the filter element is polytetrafluorethylene (PTFE).

The flow control system can include a number of valves which are controlled by software and hardware, including a processor, so that the rate of flow of the alcohol into the chamber and onto the evaporation enhancing material or device can be precisely controlled, which in turn governs the evaporation rate. The flow control system preferably includes a pair of three-way valves separated by a length of tubing, a source of pressurized inert gas, a source of liquid polar organic compound, and a control system for switching the valves so that the gas pushes the liquid into the tank at a controlled rate.

The evaporation enhancing material or device, for example the filter element, porous tube, or open trough, is preferably positioned in an upper area of the chamber.

It is highly preferred that there is no generation of alcohol vapor outside the chamber, or jetting of liquid phase alcohol within the chamber, since avoidance of such systems is an objective of the invention. However, in some systems it may be suitable to introduce some of the alcohol by the prior methods involving ionization, vaporization, or jetting along with nitrogen.

The temperature and pressure within the chamber is preferably ambient, with temperature about 20 to 25° C.

Ionization is preferred, and the ionization system preferably includes an ionizer which is controlled by a processor so as to activate ionization when the polar organic compound is being evaporated within the process chamber and thereby converted to vapor. The ionization is preferably supplied by nitrogen gas from a separate supply tube and manifold within the process tank or other than that of the drying vapor generation system supply tube. A preferred ionizer comprises a nuclear anti-static device using a Polonium-210 radioisotope which emits alpha particles which produce millions of ion pairs that in turn drain electrostatic charges off liquid surface particles and substrates during a period when the Marangoni effect is in progress within the process tank.

The preferred system for controlling the introduction of liquid polar organic solvent contains two three-way valves separated by a length of tubing, a source of pressurized inert gas, a source of liquid polar organic compound, and a control system for switching the valves so that the gas pushes the liquid into the tank at a controlled rate.

DETAILED DESCRIPTION

The preferred embodiments will be illustrated with reference to the drawings. Various other embodiments should become readily apparent from this description to those skilled in this art.

Figure 1:
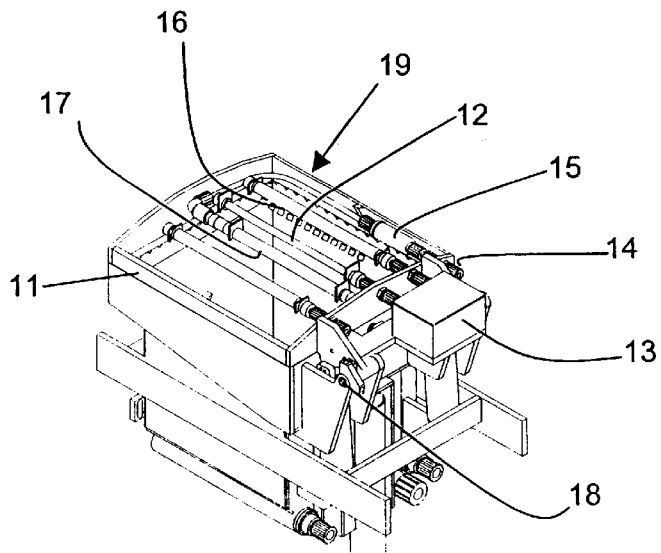
FIG. 1 is a rear perspective view of a process tank of the invention with the clear plastic cover on the lid not illustrated.

Referring first to FIG. 1 is a rear perspective view of a process tank 19 which is equipped with a liquid polar organic solvent inlet 14 which is fluidly connected to a evaporation enhancing device such as in this case a filter assembly 15, the filter assembly 15 containing a polytetrafluorethylene (PTFE) filter element (Mini Kleen-Change brand from Pall Corp.) having a surface area of about 320 cm$^2$ which is capable of being wetted with the isopropyl alcohol, the polar organic solvent used in the illustrated preferred embodiment. Filter assembly 15 is mounted in the movable lid 11, which is hinged 18 to the tank 19 from one side. The lid 11 is constructed of a transparent polyvinyl chloride (PVC) plastic and is mounted on a polyvinylidene fluoride (PVDF) process tank 19.

Figure 2:
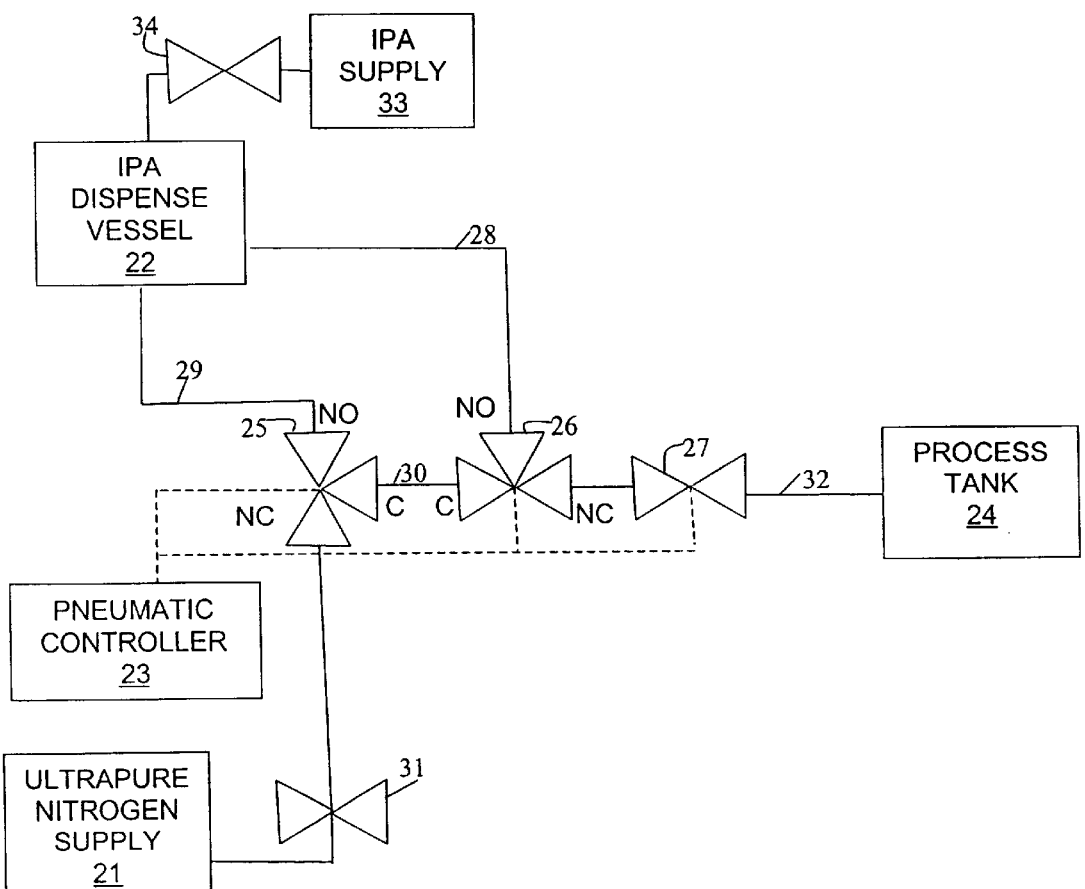
FIG. 2 is schematic of a supply system used to control the introduction of liquid polar organic compound such as isopropyl alcohol to a process tank.

FIG. 2 illustrates schematically the system of this invention whereas the IPA dispense vessel 22 is first filled by means of an IPA supply system 33 by opening valve 34 or manually filling by operator fill port (not shown). By force of gravity the IPA completely fills tube 29 passes through the normally open (no) and common (c) ports of a three-way valve 25, fills the length of tube 30, passes through ports common and normally open of three-way valve 26, and fills tube 28 to a level equal to that of the IPA dispense vessel 22. The system further comprises the steps of supplying pressurized UPN$^2$ (ultra pure nitrogen) 21 to a regulated valve 31 to the three-way valve 25. A valve 27 which provides a safety function and a length of tube 32 are connected between valve 27 and the process tank shown schematically at 24 (referred to as 19 in FIG. 1). A pneumatic signal which is actuated by the pneumatic controller 23 which in turn in controlled by a micro processor (not shown) having the ability to control valves 25, 26, and 27 simultaneously. In operation of the disclosed system, a measured amount of IPA is delivered into process tank 24 by first delivering a process signal to switch valves 25, 26, and 27, causing the supplied UPN$^2$ from valve 31 to push the liquid phase IPA contained in tube 30 through the common and normally closed ports of valve 26 and further through safety valve 27 and still further through tube 32 and into process tank 24 at inlet 14 (FIG. 1) wherein the liquid phase IPA is delivered into or onto the evaporation enhancing materials or a filter assembly 15 (FIG. 1). At this point the UPN$^2$ gas becomes multifunctional wherein after it pushes the liquid IPA into the filter 15, it speeds the evaporation of IPA as it passes over the liquid IPA surface and through the evaporation enhancing materials or filter assembly 15. The UPN$^2$ also carries the evaporated IPA vapor through the nozzle manifold 17 with sufficient velocity so as to induce a Marangoni effect on a liquid surface in an area between closely spaced substrates while supplying a preferred inert environment within the process chamber.

Using this system, the rate and amount of flow of the liquid polar organic compound such as IPA into the process tank 24, through inlet 14, and into the evaporation enhancing device, filter assembly 15, can be precisely controlled by increasing or decreasing the length of tube 30 so as to adjust the volume of IPA and also by adjusting the rate of nitrogen flow through valve 31 which in turn governs the evaporation rate.

The pneumatic controller 23 illustrated in FIG. 2 can be connected to a microprocessor or any suitable microprocessor-based programmable logic controller, personal computer controller, or the like for process control. A suitable controller includes features such as programmability, reliability and flexibility. The suitable processor includes various input/output ports or electropneumatic solenoids used to provide connections to open and close valves 25, 26, and 27 to thereby meter and supply fluids. The processor also includes sufficient memory to store process recipes for desired applications.

In another preferred embodiment, an ionizer 13 is supplied and controlled by a processor so as to activate ionization when at the same time the polar organic compound or IPA is being evaporated within the process chamber and thereby converted to vapor. The illustrated ionizer 13 comprises a nuclear anti-static device using a Polonium-210 radioisotope which emits alpha particles which produce millions of ion pairs that are delivered through the ion manifold 12 and into the process tank 19 which in turn drain any electrostatic charges off surfaces. A tube 16 with nozzles is provided for optional introduction of heated, ionized UPN$^2$.

Figure 3:
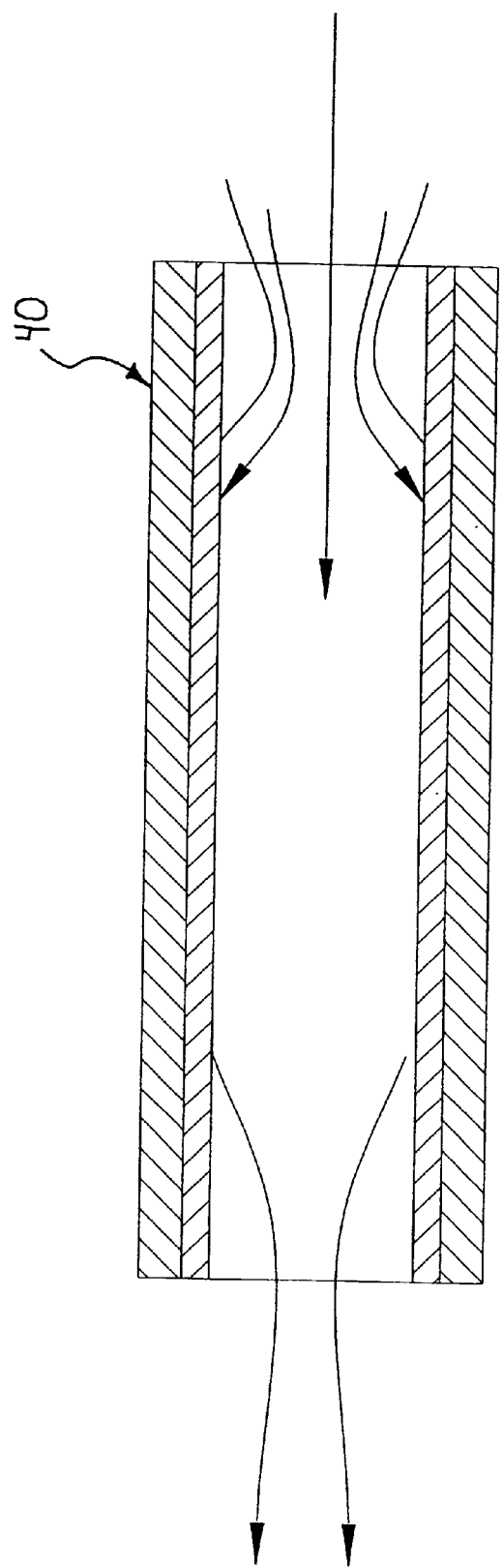
FIG. 3 is a cross-sectional view of a porous tube used in the present invention.
Figure 4:
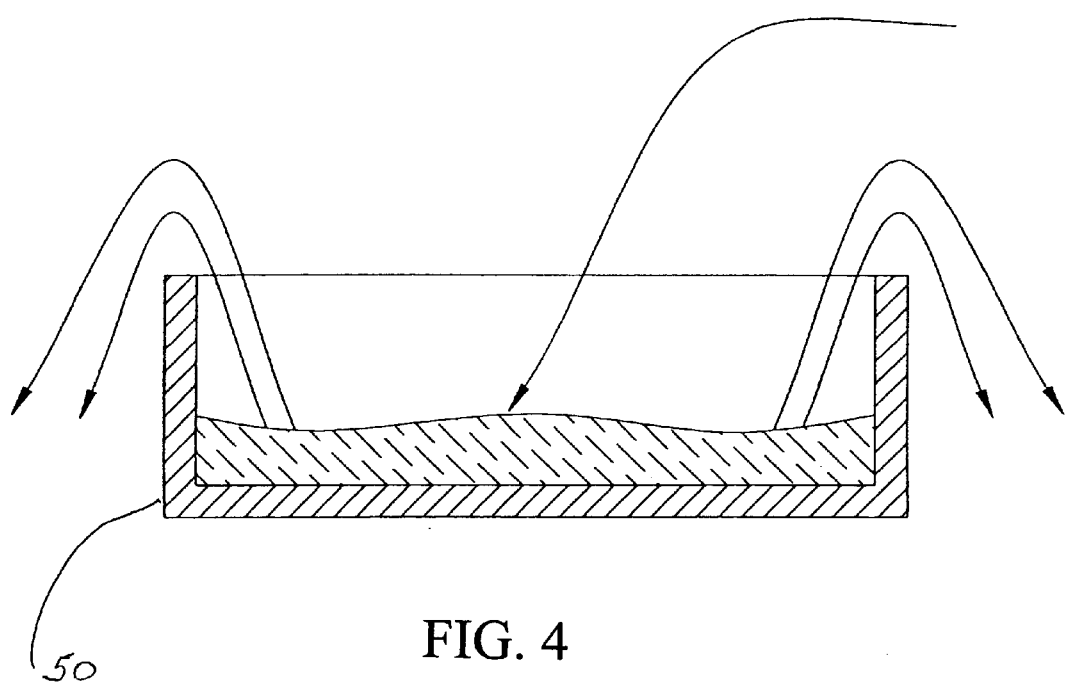
FIG. 4 is a cross-sectional view of a trough used in the present invention.
Figure 5:
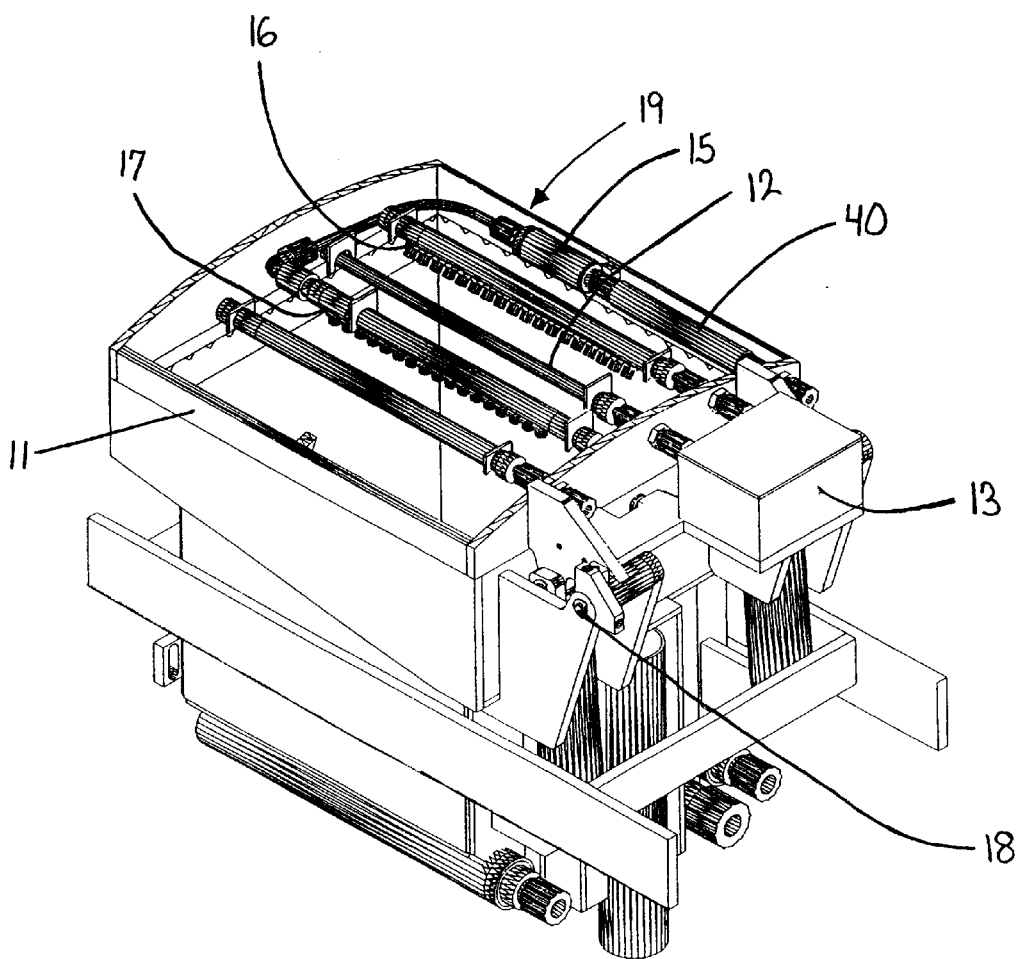
FIG. 5 is a rear perspective view of the process tank of FIG. 1 wherein the means for enhancing evaporation is the porous tube of FIG. 3.
Figure 6:
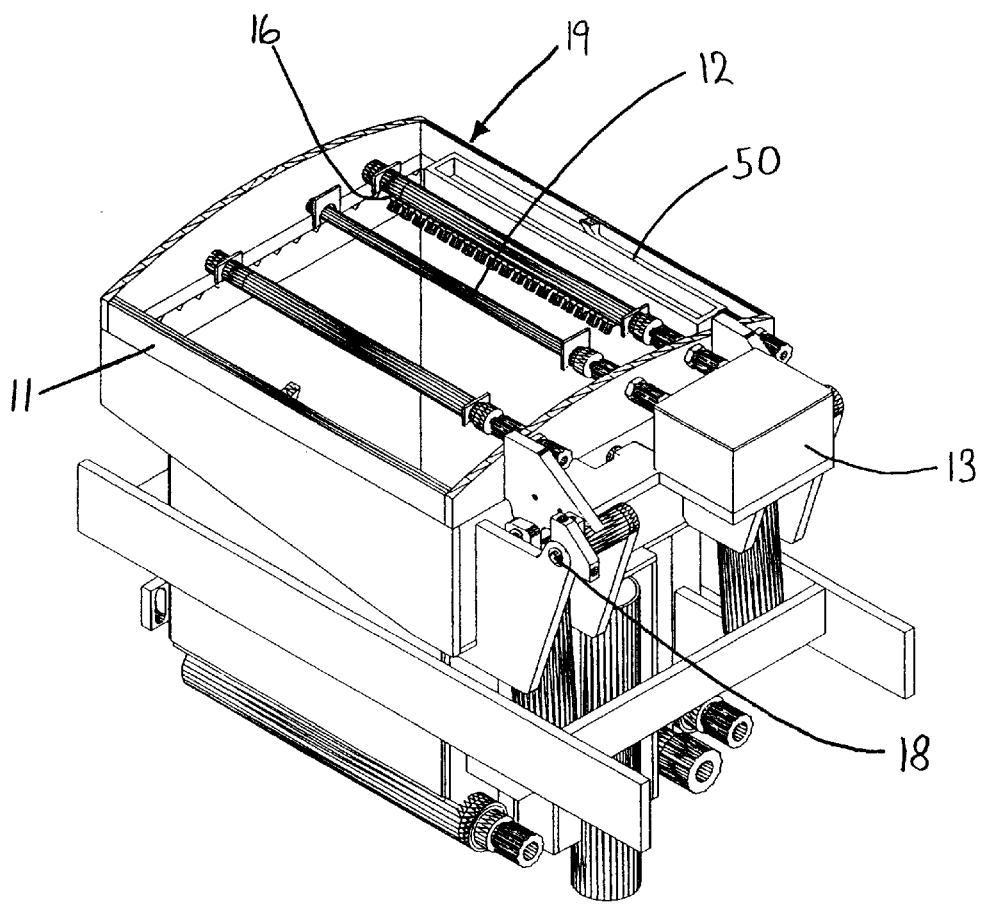
FIG. 6 is a rear perspective view of the process tank of FIG. 1 wherein the means for enhancing evaporation is the trough of FIG. 4.

Alternatively, the evaporation enhancing device can also be a porous tube 40 or a trough 50 (FIGS. 3 and 4). When the invention takes on one these embodiments, filter assembly 15 of process tank 19 is either replaced by trough 50 or coupled to porous tube 40, as illustrated in FIGS. 5 and 6.

It is highly preferred that there is no generation of alcohol vapor outside the chamber, or jetting of liquid phase alcohol within the chamber.

The drying method of this invention results in essentially dry semiconductor wafers or substrates. One or more additional steps may be required to completely dry the wafers.

While the invention and preferred embodiments have been described and illustrated in sufficient detail that those skilled in this art may readily make and use the invention, various alternatives, modifications, and improvements should become readily apparent to those skilled in this art without departing from the spirit and scope of the invention.

What is claimed is:

1. A method of drying semiconductor wafers or substrates comprising introducing a polar organic compound in liquid form onto or into means for enhancing evaporation within a process chamber, causing the liquid to evaporate and form a drying vapor within the process chamber, wherein the means for enhancing evaporation is a tube having micropores of about 20 to 50 microns in diameter.

2. Method of claim 1 wherein the polar organic compound is isopropyl alcohol (IPA).

3. Method of claim 1 wherein the polar organic compound is evaporated within the chamber under ambient conditions at about 20 to 25 ° C.

4. Method of claim 1 wherein polar organic compound vapor is generated exclusively within the process chamber.

5. A method of drying semiconductor wafers or substrates comprising introducing a polar organic compound in liquid form onto or into means for enhancing evaporation within a process chamber, causing the liquid to evaporate and form a drying vapor within the process chamber, further including using inert gas to push the liquid polar organic compound into or onto the means for enhancing evaporation.

6. Method of claim 5 wherein the means for enhancing evaporation is a porous tube, a filter housing containing a filter element, or an open trough.

7. Method of claim 5 wherein the means for enhancing evaporation comprises a filter element having a surface area of about 100 to 800 cm$^2$ which is capable of being wetted with the polar organic compound.

8. Method of claim 5 wherein the inert gas is nitrogen.

9. Method of claim 5 wherein polar organic compound vapor is generated exclusively within the process chamber.

10. A method of drying semiconductor wafers or substrates comprising introducing a polar organic compound in liquid form onto or into means for enhancing evaporation within a process chamber, causing the liquid to evaporate and form a drying vapor within the process chamber, further including controlling the rate of introduction of the polar organic compound into or onto the means for enhancing evaporation.

11. Method of claim 10 wherein the means for enhancing evaporation is porous tube, a filter housing containing a filter element, or an open trough.

12. Method of claim 10 wherein polar organic compound vapor is generated exclusively within the process chamber.

13. A method of drying semiconductor wafers or substrates comprising introducing a polar organic compound in liquid form onto or into means for enhancing evaporation within a process chamber, causing the liquid to evaporate and form a drying vapor within the process chamber wherein the means for enhancing evaporation causes evaporation of the alcohol by capillary force due to wicking.

14. Method of claim 13 wherein the means for enhancing evaporation is porous tube a filter housing containing a filter element, or an open trough.

15. Method of claim 13 wherein polar organic compound vapor is generated exclusively within the process chamber.

16. An apparatus for drying semiconductor wafers or substrates comprising a process chamber, means for enhancing evaporation of polar organic compound within the chamber, and means to introduce polar organic compound in liquid form into or onto the means for enhancing evaporation, whereby the polar organic compound is converted from liquid form to vapor form within the chamber wherein the means for enhancing evaporation is adapted to provide wicking action by capillary force so as to cause evaporation of the polar organic compound.

17. Apparatus of claim 16 wherein the means for enhancing evaporation is an open trough, a filter element, or a microporous tube.

18. Apparatus of claim 16 wherein the means for enhancing evaporation is a filter assembly having a filter media, a flat-bottomed trough, or a microporous tube.

19. Apparatus of claim 16 wherein the means for enhancing evaporation is a filter assembly comprising a fluoropolymer filter element.

20. Apparatus of claim 16 wherein the means for enhancing evaporation is positioned in an upper area of the chamber.

21. An apparatus for drying semiconductor wafers or substrates comprising a process chamber, means for enhancing evaporation of polar organic compound within the chamber, and means to introduce polar organic compound in liquid form into or onto the means for enhancing evaporation, whereby the polar organic compound is converted from liquid form to vapor form within the chamber wherein the means to introduce the polar organic compound in liquid form comprises a processor and a series of valves controlled by the processor to precisely meter flow of liquid polar organic compound.

22. Apparatus of claim 21 wherein the valves comprise two three-way valves separated by a length of tubing, and the means to introduce the polar organic compound further includes a source of pressurized inert gas, a source of liquid polar organic compound, and a control system for switching the valves so that the gas pushes the liquid into the tank at a controlled rate.

23. The apparatus of claim 21 wherein the means for enhancing evaporation is an open trough, a filter element, or a microporous tube.

24. An apparatus for drying semiconductor wafers or substrates comprising a process chamber, means for enhancing evaporation of polar organic compound within the chamber, means to introduce polar organic compound in liquid form into or onto the means for enhancing evaporation, whereby the polar organic compound is converted from liquid form to vapor form within the chamber, and further including means to ionize the polar organic compound.

25. Apparatus of claim 24 including an ionizer and means to turn on the ionizer during vapor generation within the chamber.

26. The apparatus of claim 24 wherein the means for enhancing evaporation is an open trough, a filter element, or a microporous tube.

27. An apparatus for drying semiconductor wafers or substrates comprising a process chamber, means for enhancing evaporation of polar organic compound within the chamber, and means to introduce polar organic compound in liquid form into or onto the means for enhancing evaporation, whereby the polar organic compound is converted from liquid form to vapor form within the chamber wherein the means for enhancing evaporation is a flat-bottomed trough made from polyvinylidene fluoride (PVDF), a tube for introducing liquid polar organic compound into the trough, and a processor-controlled valve for controlling the rate of flow of polar organic compound into the trough.

28. An apparatus for drying semiconductor wafers or substrates comprising a process chamber, means for enhancing evaporation of polar organic compound within the chamber, and means to introduce polar organic compound in liquid form into or onto the means for enhancing evaporation, whereby the polar organic compound is converted from liquid form to vapor form within the chamber wherein the means for enhancing evaporation is a porous tube having micropores of about 20 to 50 microns diameter.

* * * * *